(12) United States Patent
Thiruvengadam et al.

(10) Patent No.: US 7,376,038 B2
(45) Date of Patent: May 20, 2008

(54) FAST ACCESS MEMORY ARCHITECTURE

(75) Inventors: Sudha Thiruvengadam, Richardson, TX (US); Ramaprasath Vilangudipitchai, Dallas, TX (US); David B. Scott, Plano, TX (US); Uming U. Ko, Plano, TX (US); Alice Wang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 240 days.

(21) Appl. No.: 11/385,151

(22) Filed: Mar. 21, 2006

(65) Prior Publication Data

US 2007/0223294 A1 Sep. 27, 2007

(51) Int. Cl.
*G11C 5/14* (2006.01)

(52) U.S. Cl. .................. 365/227; 365/230.06; 365/203; 365/233

(58) Field of Classification Search ................ 365/227, 365/230.06, 203, 233
See application file for complete search history.

(56) References Cited

U.S. PATENT DOCUMENTS 5,903,509 A * 5/1999 Ryan et al. ............. 365/230.03
6,621,753 B2 * 9/2003 Fujimoto et al. ........... 365/222

* cited by examiner

*Primary Examiner*—Tuan T. Nguyen
(74) *Attorney, Agent, or Firm*—Ronald O. Neerings; Wade J. Brady, III; Frederick J. Telecky, Jr.

(57) ABSTRACT

A computer system including a control logic and a storage coupled to the control logic. The storage includes a plurality of bitcells and bitlines used to transfer data between the control logic and the bitcells. The control logic provides an address of a target bitcell to the storage. Within a single clock cycle, the storage uses the address to activate the target bitcell, to precharge bitlines coupled to the target bitcell, and to access the target bitcell.

20 Claims, 6 Drawing Sheets

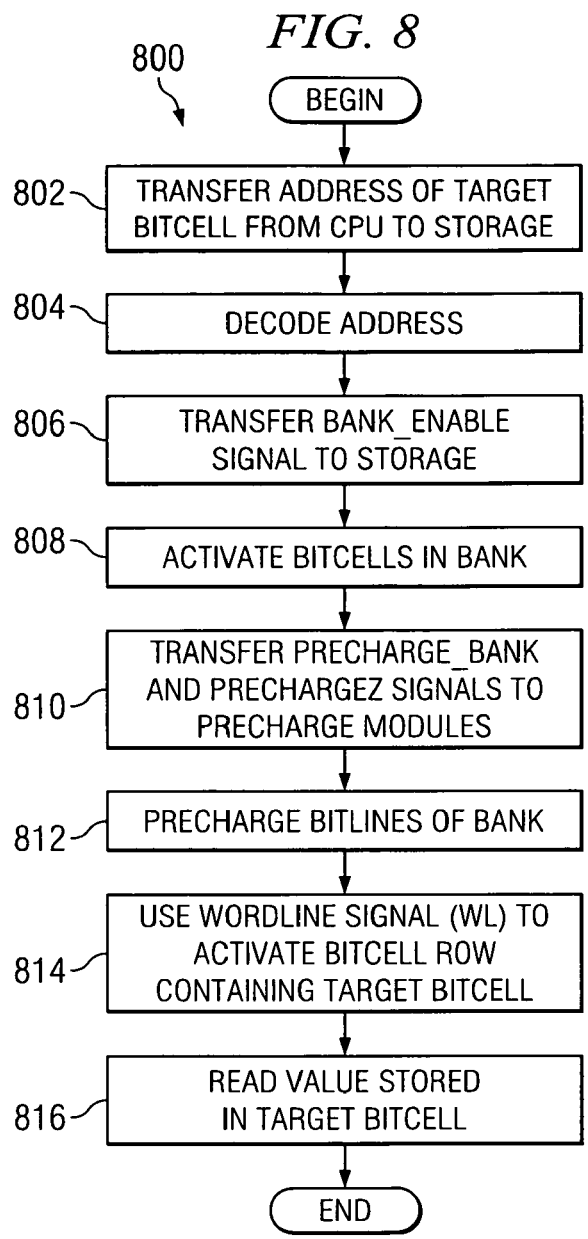
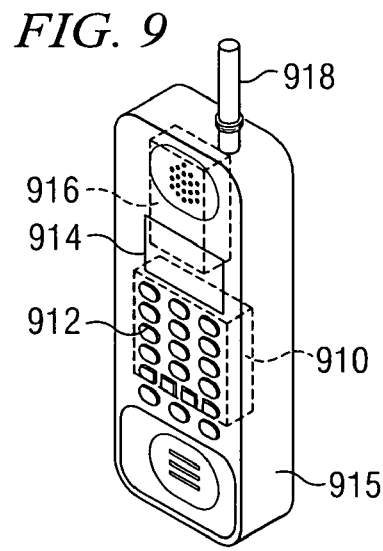

FAST ACCESS MEMORY ARCHITECTURE

BACKGROUND

Reducing power consumption is desirable in most computer systems, and is especially desirable in battery-operated, mobile computer systems (e.g., mobile phones, digital personal assistants, laptop computers) which are provided with limited power supplies. Increasing performance also is desirable in most computer systems, and is especially desirable in mobile systems since they run an increasing number of applications which demand high performance capability from the system hardware. However, a reduction in power consumption generally entails an undesirable reduction in performance. Likewise, an increase in performance generally entails an undesirable increase in power consumption.

BRIEF SUMMARY

Described herein is a memory architecture which conserves power without having a detrimental impact on system performance or data integrity. An illustrative embodiment includes a computer system comprising a control logic and a storage coupled to the control logic. The storage comprises a plurality of bitcells and bitlines used to transfer data between the control logic and the bitcells. The control logic provides an address of a target bitcell to the storage. Within a single clock cycle, the storage uses the address to activate the target bitcell, to precharge bitlines coupled to the target bitcell, and to access the target bitcell.

Another illustrative embodiment includes a storage comprising a bitcell adapted to switch between a bitcell power conservation state and a bitcell active state. The storage further comprises bitlines coupled to the bitcell and adapted to transfer data to and from the bitcell. The bitlines are adapted to switch between a bitline power conservation state and a bitline active state. Within a single clock cycle, the bitcell switches from the bitcell power conservation state to the bitcell active state, the bitlines switch from the bitline power conservation state to the bitline active state, and the bitcell is accessed.

Yet another illustrative embodiment includes a method comprising decoding a target bitcell address to produce first, second and third signals. The method also comprises, within a single clock cycle, activating the target bitcell using the first signal. The method also comprises, within the clock cycle, precharging bitlines coupled to the target bitcell using the second signal. The method further comprises, within the clock cycle, using the third signal to access data in the target bitcell via the bitlines.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to." Also, the term "couple" or "couples" is intended to mean either an indirect or direct connection. Thus, if a first device couples to a second device, that connection may be through a direct connection, or through an indirect connection via other devices and connections. The term "module" is intended to mean any circuit logic collectively used for one or more purposes. A module does not necessarily comprise circuit logic which is distinctly separate from other circuit logic, but may in some cases be a portion of a larger circuit logic or may be coupled to other circuit logic.

BRIEF DESCRIPTION OF THE DRAWINGS

For a more detailed description of the preferred embodiments of the present invention, reference will now be made to the accompanying drawings, wherein:

FIG. 8 shows a flow diagram describing operation of the system of FIG. 1, in accordance with embodiments of the invention; and FIG. 9 shows a mobile communication device implementing the computer system of FIG. 1, in accordance with embodiments of the invention.

DETAILED DESCRIPTION OF THE PREFERRED EMBODIMENTS

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a memory architecture which conserves power without having a detrimental impact on system performance or data integrity. A memory implementing the architecture is partitioned into a plurality of banks. Each bank comprises a plurality of bitcells. Bitcells in a bank may be accessed by first activating the bank, and then accessing a particular bitcell or group of bitcells in the bank. Each bank may be activated independently of the other banks. When a bank is inactive, the inactive bank is provided with less power than when active. When an inactive bank is activated, the bank is provided with additional power and is accessed to read or write data without compromising data integrity, preferably all within a single clock cycle. Likewise, when an active bank is inactivated, the power provided to the bank is decreased. In this way, power supplied to the memory is conserved, and power leaked through banks is minimized or at least reduced.

Figure 1:
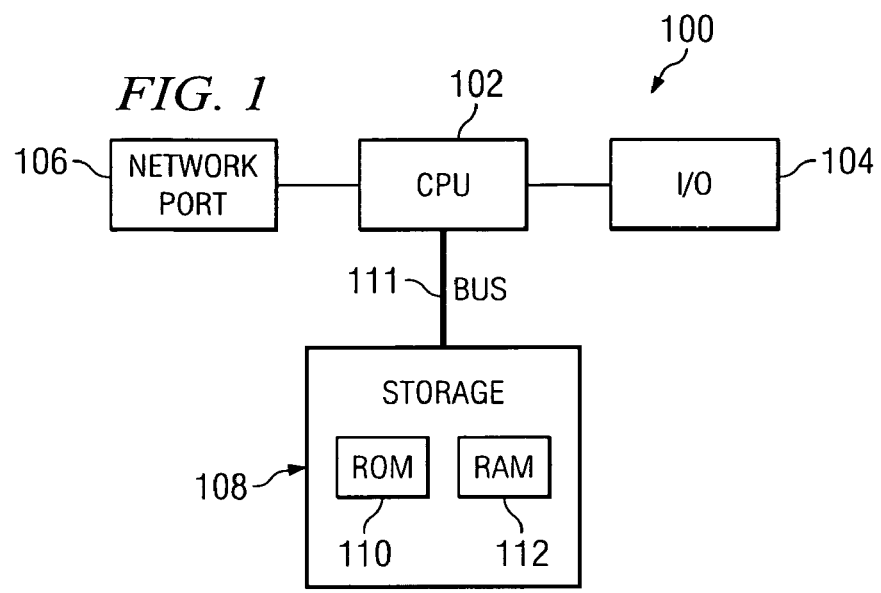
FIG. 1 shows a computer system comprising a memory which is in accordance with embodiments of the invention.

FIG. 1 shows an illustrative computer system 100 implementing the memory architecture described above. The computer system 100 comprises a central processing unit (CPU) 102 (also termed a "processor" and/or a "control logic"), one or more input/output (I/O) devices 104, a network port 106 and a storage 108. In turn, the storage 108 comprises a read-only memory (ROM) 110 and a random access memory (RAM) 112 having the power-conserving memory architecture. The ROM 110 may comprise various software applications executed by the CPU 102, such as firmware, an operating system (OS), etc. The CPU 102 transfers signals to and from the storage 108 (e.g., the RAM 112) via bus 111. Such signals may comprise data to be stored in the storage 108, data retrieved from the storage 108, clock signals produced by the CPU 102, addresses, etc. The I/O devices 104 may comprise any of a variety of devices usable to provide data to and receive data from the computer system 100. For example, the I/O devices 104 may comprise keyboards, mice, displays, audio recording devices, video recording devices, image capturing devices, other computer systems, etc. The system 100 may communicate with other computers via the network port 106 (e.g., via the Internet or a local area network (LAN)). Network connections made via network port 106 may be wired and/or wireless.

Figure 2:
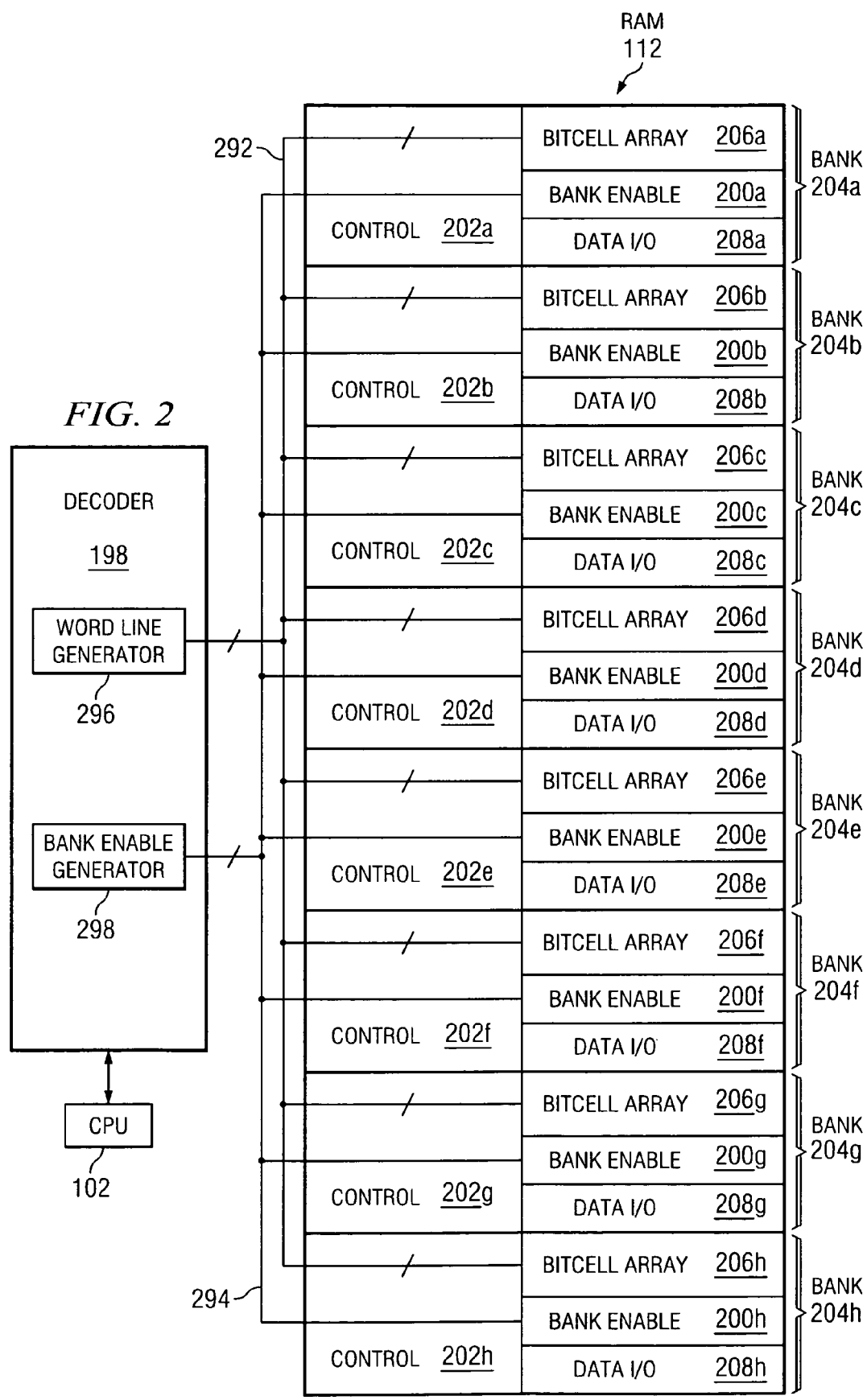
FIG. 2 shows a detailed view of the memory of FIG. 1, in accordance with embodiments of the invention.

FIG. 2 shows a detailed view of the RAM 112. In at least some embodiments, the RAM 112 comprises synchronous dynamic RAM (SDRAM), although the RAM 112 may comprise any type of RAM, such as static RAM (SRAM), DRAM, etc. As previously mentioned, the RAM 112 is partitioned into a plurality of banks 204. The banks 204 couple to a decoder 198. Each bank 204 comprises a bitcell array 206, a bank enable module 200, a data I/O module 208, and a control module 202. Each bitcell array comprises bitcells used to store data in a corresponding bank. Each bank enable module 200 is used to activate and/or inactivate a corresponding bank 204. Each data I/O module 208 is used to transfer data between the CPU 102 and bitcells in a corresponding bitcell array 206. Each control module 202 is used to access data in the bitcells of a corresponding bank.

For purposes of this discussion, the eight banks of FIG. 2, as well as the components of each bank, are further labeled using letters as shown (e.g., banks 204a-204h, bitcell arrays 206a-206h). In at least some embodiments, each bitcell array 206 comprises eight columns of bitcells and 32 rows of bitcells, for a total of 256 bitcells per bitcell array. Furthermore, in some such embodiments, the RAM 112 comprises eight banks 204 as shown, for a total of two kilobits of storage in the RAM 112. The RAM 112 is not limited to any particular size and the bitcell arrays 206 are not limited to any particular arrangement.

Bitcells in bitcell arrays are selected for access (e.g., read access or write access) based on selection data received from the CPU 102. The decoder 198 and the control modules 202 receive selection data from the CPU 102, decode the data, and provide the decoded data to the banks 204. Examples of selection data received from the CPU 102 may include addresses, chip select signals (CS), read enable (RE) and write enable (WE) signals, clock (CLK) signals, etc. The decoder 198 decodes the selection data using a word line generator 296 and a BANK_ENABLE generator 298. The word line generator 296 generates signals which are transferred to the bitcell arrays 206 of each bank and are used to activate and/or inactive bitcells in the arrays. The BANK_ENABLE generator 298 generates signals which are transferred to the bank enable modules 200 of each bank 204 and are used to activate and/or inactivate entire banks 204.

The control modules 202 comprise circuit logic which, after decoding selection data received from the CPU 102, produce signals that are used to read and/or write data from bitcells in corresponding bitcell arrays 206. Details regarding the word line generator 296, the BANK_ENABLE generator 298 and the control modules 202 are provided further below.

Figure 3:
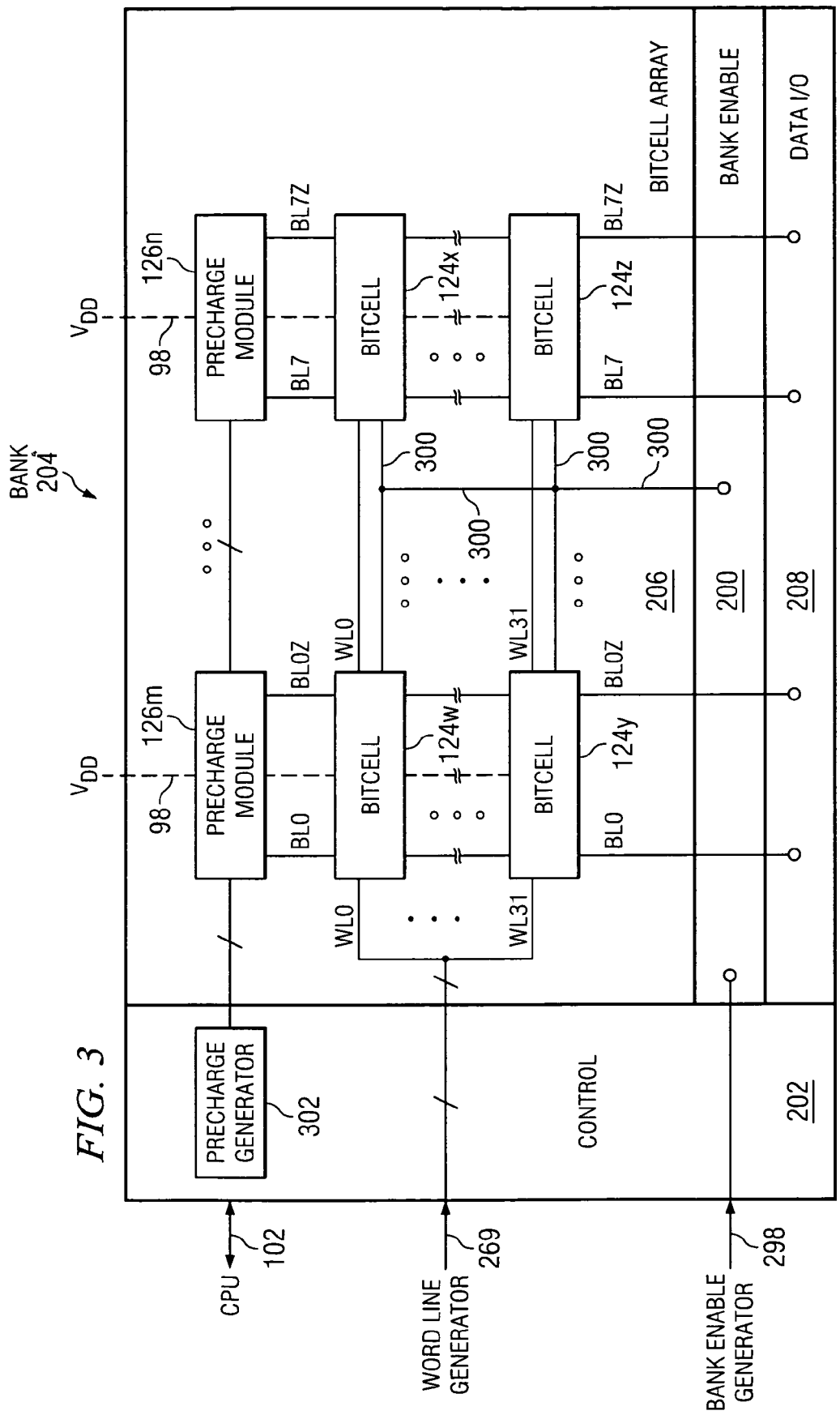
FIG. 3 shows a detailed view of a bank of the memory of FIG. 2, in accordance with embodiments of the invention.

FIG. 3 shows a detailed view of a bank 204. The bitcell array 206 comprises a plurality of bitcells 124 (e.g., 256 bitcells arranged in 8 columns and 32 rows). For purposes of this discussion, the bitcells 124 shown in FIG. 3 are further labeled as bitcells 124w, 124x, 124y and 124z. Bitcells 124w and 124y are included in the first, or "leftmost," column. Bitcells 124x and 124z are included in the last, or "rightmost," column. Bitcells 124w and 124x are included in the first, or "top," row, and bitcells 124y and 124z are included in the last, or "bottom," row. Each row of bitcells receives a word line signal (WL) from the word line generator 296 which activates and/or inactivates the bitcells on that row. For example, bitcells 124w and 124x each receive the WL0 signal as shown. In some embodiments, an asserted WL0 signal causes the bitcells 124w and 124x to be activated, and an unasserted WL0 signal causes the bitcells 124w and 124x to be inactivated. In other embodiments, an asserted WL0 signal causes bitcells 124w and 124x to be inactivated and an unasserted WL0 signal causes bitcells 124w and 124x to be activated. Because the bitcell array 206 preferably comprises 32 rows, the word line generator 296 provides each bitcell array 206 with 32 word line signals WL0-WL31.

Bitcells activated by a word line may be accessed for reads and/or writes via data buses known as bitlines. Specifically, the bitcells in the bitcell array 206 transfer data to and receive data from the data I/O module 208 via the bitlines. Each bitcell in each column of the array preferably couples to a pair of bitlines. For instance, bitcells in the first column (i.e., the column comprising bitcells 124w and 124y) couple to bitlines BL0 and BL0Z. The bitline BL0 carries the value which is to be stored or retrieved from a bitcell in the column, and the bitline BL0Z carries the inverse of the BL0 value. Thus, for example, if the bitline BL0 carries a "1" bit, the BL0Z carries a "0" bit. Because eight columns of bitcells are preferred in the array 206, the bank 204 preferably comprises eight pairs of bitlines, one pair for each column of the array. Because multiple bitcells in a column share a pair of bitlines, bitcells in the same column generally are accessed one at a time.

Bitlines coupled to a bitcell generally should be "precharged" prior to reading from that bitcell. Accordingly, the bitcell array 206 further comprises a plurality of precharge modules 126. Each column of the array 206 preferably couples to one precharge module, and thus in embodiments with 8 columns of bitcells, the array 206 comprises 8 precharge modules. In FIG. 3, two precharge modules 126 are shown. For purposes of discussion, these precharge modules 126 are further labeled as precharge modules 126m and 126n. Precharge module 126m couples to the first column of bitcells, and precharge module 126n couples to the last column of bitcells. The precharge modules 126 charge the bitlines to different voltages, depending on the signals received from a precharge generator 302 in the control module 202. The precharge modules 126 and the bitcells 124 receive power from $V_{DD}$ connections 98 (e.g., 1.2V).

Bitcells in a bank 204 generally are not accessed until the bank 204 has been activated. A bank 204 is activated using the BANK_ENABLE generator 298 (FIG. 2). The BANK_ENABLE generator 298 produces the BANK_ENABLE signal which is provided to the bank enable module 200. In turn, the bank enable module 200 processes the signal and produces an activation signal 300 to each of the bitcells 124. If the BANK_ENABLE signal is asserted, then most or all of the bitcells 124 are activated. Conversely, if the BANK_ENABLE signal is unasserted, then most or all of the bitcells 124 are inactivated. In preferred embodiments, because most or all of the bitcells 124 are provided with the same activation signal 300, most or all of the bitcells 124 are in the same state (i.e., active or inactive). The activation and inactivation of the bitcells 124 is described in detail further below.

Figure 4:
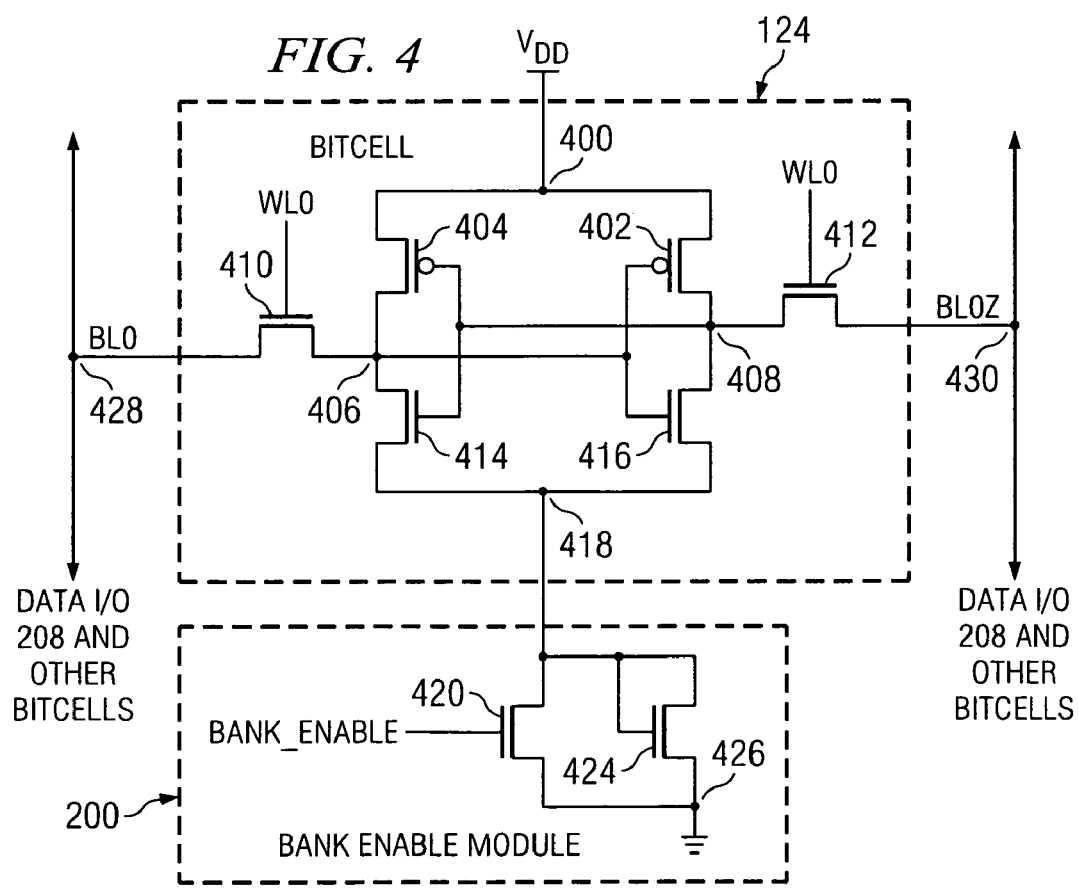
FIG. 4 shows a detailed view of a bitcell of the bank of FIG. 3, in accordance with preferred embodiments of the invention.

Details of the bitcell 124 and bank enable module 200 are now described in context of FIG. 4, followed by a description of the precharge module 126, the precharge generator 302 and the decoder 198.

FIG. 4 shows a detailed view of the bitcell 124w and the bank enable module 200. The circuit logic shown in FIG. 4 may also be representative of the other bitcells 124. The bitcell 124w comprises n-channel metal oxide semiconductor (NMOS) transistors 410, 412, 414 and 416. The bitcell 124w comprises p-channel MOS (PMOS) transistors 402 and 404. Transistors 402 and 404 couple via node 400, which also couples to $V_{DD}$. Transistor 410 couples to transistors 402, 404, 414 and 416 via node 406. Transistor also couples to bitline BL0 at node 428. Transistor 412 couples to transistors 402, 404, 414 and 416 via node 408. Transistor 412 also couples to bitline BL0Z at node 430. Transistors 414 and 416 couple via node 418, which couples to bank enable module 200. Bank enable module 200 comprises NMOS transistors 420 and 424 which couple via node 418 and via node 426. In turn, node 426 couples to ground. Transistor 420 receives the BANK_ENABLE signal at its gate. The transistors 410 and 412 receive the word line signal WL0 at their gates.

Still referring to FIG. 4, the amount of power leaked by the bitcell 124w is proportional to the voltage applied to the bitcell 124w across nodes 400 and 418. A greater voltage applied across nodes 400 and 418 results in greater leakage, and a lesser voltage applied across nodes 400 and 418 results in proportionately lesser leakage. Accordingly, when the bank 204 is inactive (and thus the bitcell 124w is inactive), the bank enable module 200 is used to reduce the voltage across the nodes 400 and 418. When the bank 204 is active (and thus the bitcell 124w is active), the bank enable module 200 is used to increase the voltage across the nodes 400 and 418 such that the bitcell 124w is accessible for data reads and writes. The voltage applied across nodes 400 and 418 is regulated as follows.

As previously mentioned, the bank enable module 200 comprises transistors 420 and 424. When inactive, the transistor 424 carries a voltage drop (e.g., about 0.25V to 0.5V), and thus the transistor 424 is capable of acting as a diode. The transistor 420 acts as a switch which activates and inactivates the transistor (i.e., diode) 424. When the bank 204 is inactive, the BANK_ENABLE signal is unasserted (forced low). If the BANK_ENABLE signal is unasserted, the transistor 420 is off, and thus the transistor 424 provides a diode drop of between 0.25 V and 0.5 V. In this way, the voltage applied across nodes 400 and 418 is decreased from $V_{DD}$ (e.g., 1.2V) by the drop across 424, and because the voltage across nodes 400 and 418 is decreased, the power leaked through the bitcell 124w is decreased. The voltage from node 400 to node 418 is thus $V_{DD}-V_T$, where $V_T$ is the threshold voltage of an NMOS (e.g., 250-500 mV). Such a reduced voltage across nodes 400 and 418 is acceptable because the bank 204, and thus the bitcell 124w, is in a dormant or inactive state.

Similarly, when the bank 204 is active, the BANK_ENABLE signal is asserted. If the BANK_ENABLE signal is asserted, both the transistors 420 and 424 are active, and there is no voltage drop. Thus, the node 418 effectively couples to ground (e.g., $V_{SS}$) and the voltage across nodes 400 and 418 is $V_{DD}$. In this way, the bitcell 124w is provided with sufficient voltage when it is in an active state. Generation of the BANK_ENABLE signal is described below.

Figure 5:
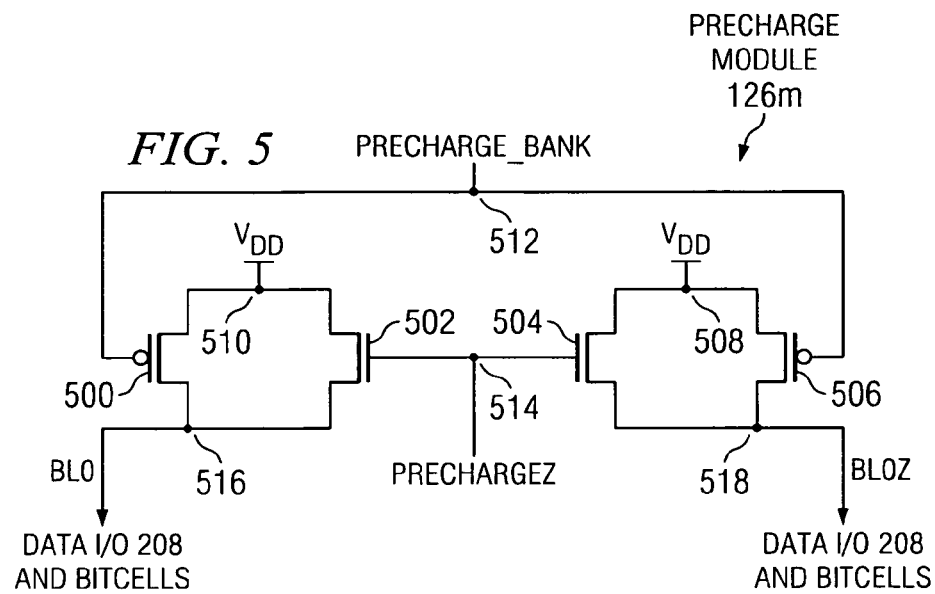
FIG. 5 shows a detailed view of a precharge module of the bank of FIG. 3, in accordance with preferred embodiments of the invention.

FIG. 5 shows a detailed view of the precharge module 126m used to precharge bitlines. The circuit logic shown in FIG. 5 is also representative of other precharge modules 126. The precharge module 126m comprises NMOS transistors 502 and 504 and PMOS transistors 500 and 506. The gates of transistors 502 and 504 couple at node 514, which receives a signal PRECHARGEZ, described further below. Transistors 500 and 502 couple via nodes 510 and 516. Node 510 couples to $V_{DD}$, and node 516 couples to bitline BL0. Likewise, transistors 504 and 506 couple via nodes 508 and 518. Node 508 couples to $V_{DD}$, and node 518 couples to bitline BL0Z. The gates of transistors 500 and 506 couple at node 512, which receives a signal PRECHARGE_BANK, also described below.

Thus far, the implementation of signals PRECHARGE_BANK, PRECHARGEZ and BANK_ENABLE have been described. The precharge generator 302 generates the signals PRECHARGE_BANK and PRECHARGEZ which are provided to the precharge modules 126. The word line generator 296 of decoder 198 generates a word line signal for each row of bitcells in the bank 204. The bank enable generator 298 of decoder 198 generates the BANK_ENABLE signal. Each of these generators 302, 298 and 296 is now discussed in turn.

Figure 6:
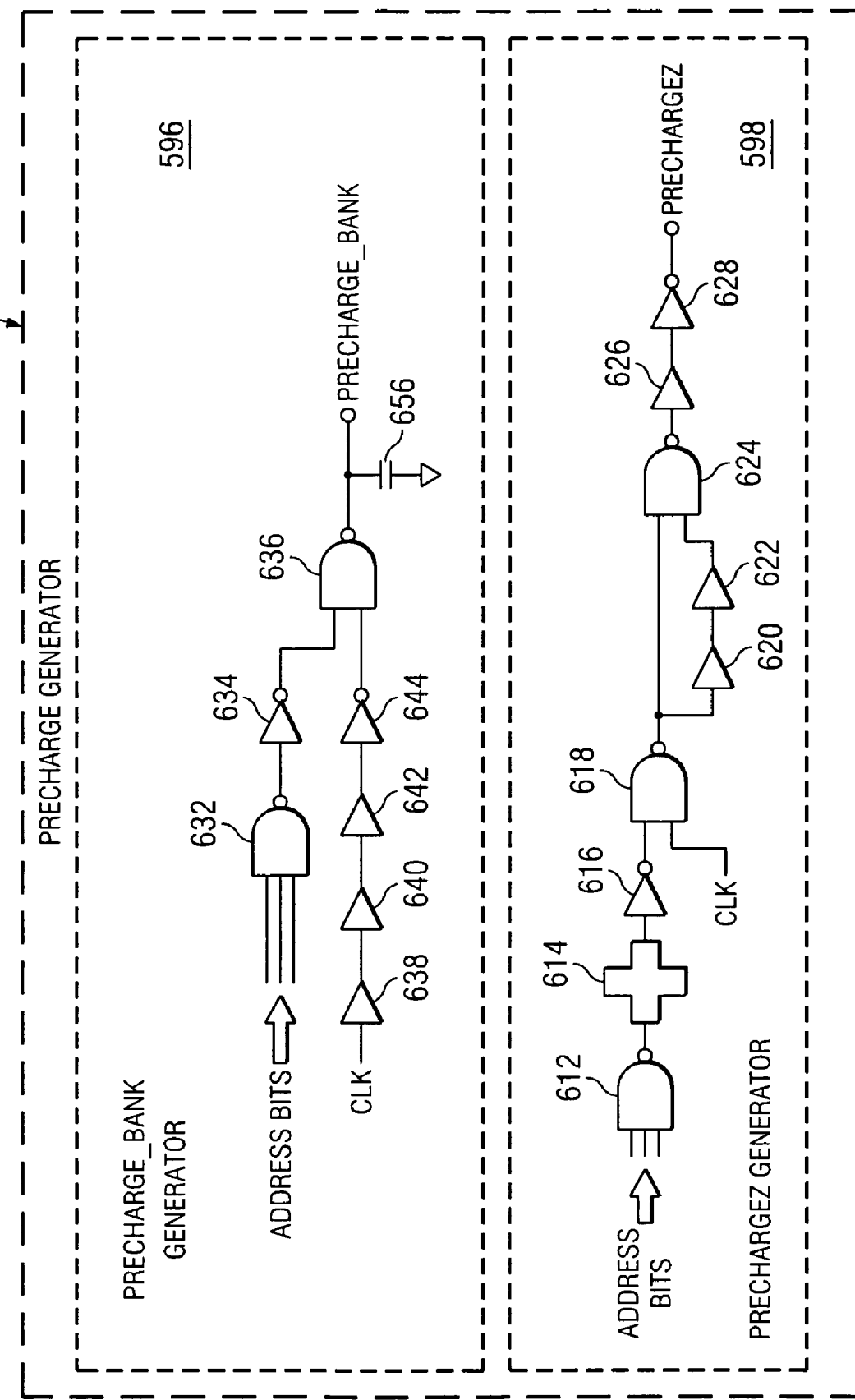
FIG. 6 shows a detailed view of a precharge generator of the bank of FIG. 3, in accordance with preferred embodiments of the invention.

Referring to FIG. 6, precharge generator 302 generates the PRECHARGE_BANK and PRECHARGEZ signals. The PRECHARGE_BANK signal is generated by the PRECHARGE_BANK generator 596 and the PRECHARGEZ signal is generated by the PRECHARGEZ generator 598. The PRECHARGE_BANK generator 596 comprises NAND gates 632 and 636, inverters 634 and 644, and buffers 638, 640, and 642. The generator 596 also comprises a capacitor 656, the value of which in some embodiments depends on the number of columns in the bank 204 (e.g., value of capacitor 656 is approximately 3.5 fF multiplied by the number of columns). The precharge generator 302 receives addresses from the CPU 102. Computer systems vary in addressing techniques, and thus there is no preferred combination of address bits used. Instead, any suitable combination of address bits which cause the precharge decoder 302 to operate in accordance with embodiments of the invention may be used.

A combination of address bits is input to the NAND gate 632. The output of the NAND gate 632 is inverted by inverter 634 and is input to the NAND gate 636. The NAND gate also receives as input a CLK signal (e.g., a clock dedicated to memory) from the CPU 102 which is buffered by buffers 638, 640 and 642, and inverted by inverter 644. The NAND gate 636 produces the PRECHARGE_BANK signal, which charges the capacitor 656. The PRECHARGE_BANK signal is transferred to the precharge modules 126 as described above in context of FIG. 5.

The PRECHARGEZ generator 598 comprises NAND gates 612, 618 and 624. The generator 598 further comprises a latch 614, inverters 616 and 628, and buffers 620, 622 and 626. The NAND gate 612 receives a combination of three address bits, but as with the precharge bank generator 596, the combination of address bits provided to NAND gate 612 may vary between systems. The output of the NAND gate 612 is latched by latch 614, inverted by inverter 516 and then provided to NAND gate 618. The NAND gate 618 also receives a CLK signal from the CPU 102 as an input. The NAND gate 618 produces an output signal which is provided both directly to the NAND gate 624 as well as through a pair of buffers 620 and 622. The output of the NAND gate 624 is buffered by buffer 626 and inverted by inverter 628. The output of the inverter 628 is the PRECHARGEZ signal, which is provided to the precharge modules 126 as described above in context of FIG. 5. The BANK_ENABLE generator 298 is now described, followed by a description of the word line generator 296.

Figure 7:
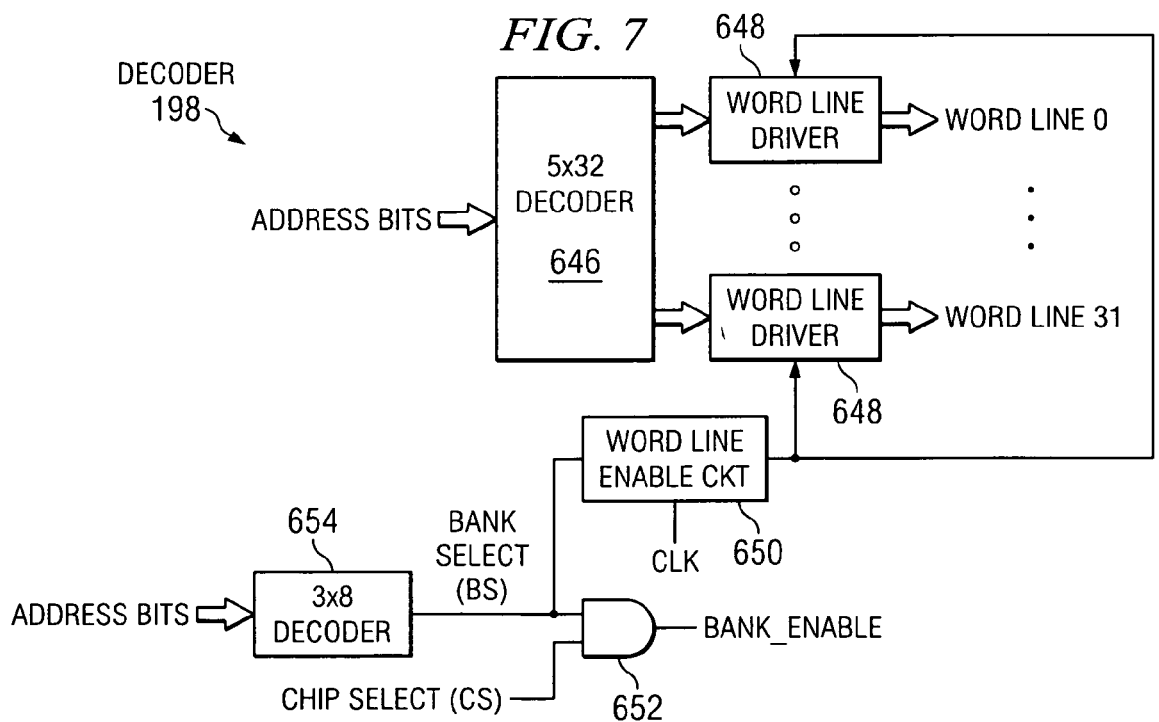
FIG. 7 shows a detailed view of the decoder of the memory of FIG. 1, in accordance with embodiments of the invention.

Referring to FIG. 7, the BANK_ENABLE generator 298 comprises a 3×8 decoder 654 and an AND gate 652. The 3×8 decoder receives address bits from the CPU 102 and, in turn, decodes the address bits to produce a bank select (BS) signal. The BS signal is provided to the AND gate 652, along with a chip select (CS) signal from the CPU 102. The CS signal is used to select a particular memory for access. It is used to distinguish between selected and unselected memories which may have the same or similar address inputs. The AND gate 652 produces the BANK_ENABLE signal, which is transferred to the bank enable module 200 as discussed above in context of FIGS. 3 and 4.

The word line generator 296 comprises a 5×32 decoder 646, a plurality of word line drivers 648, and a word line enable circuit 650. In some embodiments, the word line drivers 648 each comprise a three-stage circuit logic which drives array voltage $V_{DD}$ to the word line signal for row selected based on the decoded address. The word line enable circuit 650 receives as input the BS signal from the bank enable generator 208 and the CLK signal from the CPU 102. The word line enable circuit 650 produces an output signal which is input to the word line drivers 648. The word line drivers 648 also receive the output of the 5×32 decoder 646, which is determined by a suitable combination of address bits input to the decoder. The word line drivers 648 produce word line signals WL0-WL31, which are transferred to the bitcells 124 as discussed above in context of FIG. 3.

For clarity in the above discussion, the BANK_ENABLE generator 298 in FIG. 7 is shown as producing only one BANK_ENABLE signal. However, because a 3×8 decoder 654 is used, a total of 8 BANK_ENABLE signals are produced. A different BANK_ENABLE signal is produced for each of the 8 banks 204. A bank that is to be activated receives an asserted BANK_ENABLE signal, whereas a bank that is to be inactivated receives an unasserted BANK_ENABLE signal.

Further, the set of 32 word line signals produced by the word line generator 296 is provided to the bitcell arrays of each of the banks 204. However, the word line signals are only used to control bitcells in active banks. Thus, for example, assume bank 204a receives an asserted BANK_ENABLE signal and bank 204b receives an unasserted BANK_ENABLE signal. Further assume that an asserted word line WL0 is provided to the first row of bitcells in each bank. Because the BANK_ENABLE signal to bank 204a is asserted, bank 204a is activated. Because bank 204a is active, the asserted word line WL0 causes the first row of bitcells in bank 204a to be activated. However, because the BANK_ENABLE signal to bank 204b is unasserted, bank 204b is inactivated. Thus, even though the word line WL0 provided to bank 204b is asserted, the first row of bitcells in bank 204b remains inactive.

During a read operation, both bitlines BL0 and BL0Z typically are precharged to a "1" bit (i.e., an asserted signal). In at least some embodiments, the bitlines are specifically precharged to $V_{DD}$. However, it may be unnecessary to keep the bitlines charged to $V_{DD}$ when the bitlines are not being used to transfer data. Keeping inactive bitlines charged to $V_{DD}$ wastes power through leakage. As such, in accordance with preferred embodiments of the invention, inactive bitlines are kept charged at a voltage that is approximately the difference between $V_{DD}$ and $V_T$ (i.e., $V_{DD}-V_T$), where $V_T$ is the activation voltage for an NMOS transistor (e.g., about 0.35V). Keeping the inactive bitlines charged to $V_{DD}-V_T$ minimizes, or at least reduces, the power leaked in comparison to the power lost by keeping the bitlines charged to $V_{DD}$.

For example, referring to precharge module 126m in FIG. 5, the bitline BL0 couples to node 516 and the bitline BL0Z couples to node 518. To precharge the bitlines BL0 and BL0Z to $V_{DD}-V_T$, the PRECHARGEZ signal and the PRECHARGE_BANK signals are asserted, thereby deactivating transistors 500 and 506 and activating transistors 502 and 504. Because the NMOS transistor is a poor transmitter of asserted signals, the $V_{DD}$ signal applied at nodes 508 and 510 are reduced by a voltage $V_T$ by the NMOS transistors 504 and 502, respectively. Thus, the bitlines BL0 and BL0Z are precharged to a voltage $V_{DD}-V_T$ (e.g., $V_{DD}$-0.35V). When a bitcell coupled to the bitlines BL0 and BL0Z is to be activated, the bitlines BL0 and BL0Z are precharged to $V_{DD}$ by unasserting the PRECHARGEZ and PRECHARGE_BANK signals. By unasserting the PRECHARGEZ and PRECHARGE_BANK signals, the PMOS transistors 500 and 506 are activated and NMOS transistors 502 and 504 are deactivated. PMOS transistors are good transmitters of asserted signals, and thus the $V_{DD}$ voltage applied at nodes 508 and 510 is applied to the bitlines BL0 and BL0Z. As previously mentioned, this precharging technique reduces voltage leakage on the bitlines by reducing the voltage on the bitlines when the bank comprising the bitlines is not active. The precharging technique also reduces the time needed for bitlines to be precharged to $V_{DD}$.

Referring to method 800 of FIG. 8, operation of the system 100 is now described in the context of a read operation. Referring also to FIG. 3, assume the data bit stored in the bitcell 124w is to be read and transferred to the CPU 102. Accordingly, the CPU 102 transfers an address corresponding to the bitcell 124w to the decoder 198 and the control module 202 (block 802). The address is decoded in the decoder 198 by the word line generator 296 and the BANK_ENABLE generator 298 (block 804). The circuit logic used in each of these generators to decode the address is described above. The word line generator 296 decodes the address and produces a plurality of word lines (e.g., 32 word lines WL0-WL31). Because bitcell 124w is in the top row of the bitcell array 206, word line WL0 is asserted, and word lines WL1-WL31 are unasserted. The BANK_ENABLE generator 298 produces a plurality of BANK_ENABLE signals (e.g., 8 BANK_ENABLE signals). The BANK_ENABLE signal transferred to bank 204 is asserted, and the BANK_ENABLE signals transferred to the remaining banks 204 are unasserted.

Still referring to FIGS. 3 and 8, the address is also decoded by the precharge generator 302 in the control module 202 of bank 204a (block 804). The circuit logic used by the precharge generator 302 to generate the PRECHARGE_BANK and PRECHARGEZ signals is described above. The PRECHARGE_BANK signal and the PRECHARGEZ signal generated by the precharge generator 302 corresponding to bank 204a are unasserted. The PRE- CHARGE_BANK signals and the PRECHARGEZ signals generated by the precharge generators of the remaining banks are asserted.

The asserted BANK_ENABLE signal is transferred to the bank enable module 200 (block 806). Referring to FIGS. 4 and 8, the asserted BANK_ENABLE signal activates transistor 420, which causes node 418 to couple to ground (block 808). Thus, the potential across nodes 400 and 418 is $V_{DD}$, and the bitcell 124w has been activated. Because the bank enable module 200 couples to all or nearly all bitcells in the bank, all or nearly all bitcells are activated. The unasserted PRECHARGE_BANK and PRECHARGEZ signals are transferred to precharge modules 126 (block 810). Referring to FIGS. 5 and 8, the unasserted PRECHARGE_BANK signal is applied at node 512, and the unasserted PRECHARGEZ signal is applied at node 514. The transistors 502 and 504 are deactivated and the transistors 500 and 506 are activated, thereby charging bitlines BL0 and BL0Z to $V_{DD}$ (block 812), which is supplied at nodes 508 and 510. Referring to FIGS. 3 and 8, the asserted WL0 signal is provided to each bitcell in the top row of the array 206, thereby activating each bitcell in the row (block 814). More specifically, referring to FIG. 4, the asserted WL0 signal activates transistors 410 and 412, thereby establishing an electrical path between the bitlines and the bitcell 124w. In preferred embodiments, PRECHARGE_BANK, PRECHARGEZ and BANK_ENABLE signals are generated a predetermined length of time prior to the generation of the WL signals. The predetermined length of time is such that the potential between nodes 400 and 418 is brought to $V_{DD}$ and the bitlines BL0 and BL0Z are precharged prior to activation of transistors 410 and 412 by WL0.

Referring again to FIGS. 3 and 8, after the bitlines have been precharged and the transistors 410 and 412 have been activated, the bit value stored in the bitcell 124w is forced onto the bitline BL0, and the inverse of the bit value on bitline BL0 is forced on bitline BL0Z (block 816). The data I/O module 208 determines the bit value on bitline BL0, amplifies the bit value, and transfers the bit value to the CPU 102, thereby satisfying the CPU's request to read the bit stored in bitcell 124w (block 818). Due to the decoding speed of the precharge generator 302, the BANK_ENABLE generator 298, and the word line generator 296, the bitlines are precharged to $V_{DD}$, the potential across nodes 400 and 418 is brought to $V_{DD}$, and the bitcell is accessed all within a single clock cycle.

A write operation to a bitcell 124w is performed in a manner similar to that of method 800. However, in at least some embodiments, the bitlines BL0 and BL0Z may remain precharged to $V_{DD}-V_T$ instead of $V_{DD}$ so that the data I/O module 208a can force the bitline BL0 to the bit value to be stored in the bitcell 124w.

The system 100 may be implemented in or as a battery-operated mobile communication device (e.g., a mobile phone, personal digital assistant (PDA)) 915 such as that shown in FIG. 9. The device 915 may comprise an integrated keypad 915 and a display 914. The system 100 may be included in electronics package 910 which couples to keypad 915, display 914, and radio frequency (RF) circuitry 916. The RF circuitry 916 may couple to an antenna 918. The system 100 also may be implemented in or as a general purpose computer system (e.g., laptop computer, desktop computer).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The invention claimed is:

1. A system, comprising:
 a control logic; and
 a storage coupled to the control logic, said storage comprising a plurality of bitcells and bitlines used to transfer data between the control logic and the bitcells;
 wherein the control logic provides an address of a target bitcell to the storage;
 wherein, within a single clock cycle, the storage uses the address to activate the target bitcell, to precharge bitlines coupled to the target bitcell, and to access the target bitcell.

2. The system of claim 1, wherein the target bitcell is activated and the bitlines coupled to the target bitcell are precharged before the target bitcell is accessed within said clock cycle.

3. The system of claim 1, wherein the storage comprises decode logic which generates a first signal to activate the target bitcell and a second signal to precharge the bitlines approximately one cycle before a third signal to access the target bitcell is generated.

4. The system of claim 3, wherein the decode logic comprises a decoder which decodes said address to produce the first signal and logic gates which decode said address to produce the second and third signals.

5. The system of claim 1, wherein a difference in voltage between a precharged bitline and a non-precharged bitline is approximately an activation voltage of a transistor coupled to the precharged bitline.

6. The system of claim 1, wherein a difference in voltage between the activated, target bitcell and a non-activated bitcell is approximately an activation voltage of an n-channel metal oxide semiconductor (NMOS) transistor coupled to the target bitcell.

7. The system of claim 1, wherein the system comprises a mobile communication device.

8. The system of claim 1, wherein the storage comprises a random access memory (RAM).

9. A storage, comprising:
 a bitcell adapted to switch between a bitcell power conservation state and a bitcell active state; and
 bitlines coupled to the bitcell and adapted to transfer data to and from the bitcell, said bitlines adapted to switch between a bitline power conservation state and a bitline active state;
 wherein, within a single clock cycle, the bitcell switches from the bitcell power conservation state to the bitcell active state, the bitlines switch from the bitline power conservation state to the bitline active state, and the bitcell is accessed.

10. The storage of claim 9, wherein the storage comprises a random access memory (RAM).

11. The storage of claim 9, wherein a difference between voltage on the bitlines while in the bitline power conservation state and voltage on the bitlines while in the bitline active state is approximately an activation voltage of a transistor coupled to said bitlines.

12. The storage of claim 9, wherein a difference between voltage applied to the bitcell while in the bitcell power conservation state and voltage applied to the bitcell while in the bitcell active state is approximately an activation voltage of an n-channel metal oxide semiconductor (NMOS) transistor coupled to the bitcell.

13. The storage of claim 9, wherein precharging of the bitlines is completed before the bitcell is accessed in said clock cycle.

14. The storage of claim 9 further comprising circuit logic, wherein the circuit logic produces a first signal used to switch the bitcell from the bitcell power conservation state to the bitcell active state, a second signal used to switch the bitlines from the bitline power conservation state to the bitline active state, and a third signal used to access the bitcell, wherein the first and second signals are generated prior to the third signal.

15. The storage of claim 14, wherein the circuit logic comprises a decoder which decodes an address of the bitcell to produce the first signal and a plurality of logic gates which decode said address to produce the second and third signals.

16. The storage of claim 15, wherein the decoder is capable of receiving three input signals and producing eight output signals.

17. The storage of claim 15, wherein the logic gates include a NAND gate.

18. A method, comprising:
decoding a target bitcell address to produce first, second and third signals;
within a single clock cycle, activating the target bitcell using the first signal;
within said clock cycle, precharging bitlines coupled to the target bitcell using the second signal; and
within said clock cycle, using the third signal to access data in the target bitcell via the bitlines.

19. The method of claim 18, wherein using the third signal to access data in the target bitcell comprises accessing data in the target bitcell after activating the target bitcell and precharging said bitlines.

20. The method of claim 18, wherein precharging the bitlines comprises increasing a voltage on one of said bitlines approximately by an activation voltage of a transistor coupled to the one of said bitlines.

* * * * *